(12) United States Patent
Cheng et al.

(10) Patent No.: US 8,525,292 B2
(45) Date of Patent: Sep. 3, 2013

(54) SOI DEVICE WITH DTI AND STI

(75) Inventors: Kangguo Cheng, Schenectady, NY (US); Bruce B. Doris, Brewster, NY (US); Ali Khakifirooz, Mountain View, CA (US); Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 13/088,376

(22) Filed: Apr. 17, 2011

(65) Prior Publication Data

US 2012/0261792 A1    Oct. 18, 2012

(51) Int. Cl.
*H01L 21/00* (2006.01)
(52) U.S. Cl.
USPC .......................... 257/510; 257/347
(58) Field of Classification Search
USPC ......................... 257/510, 347–354
See application file for complete search history.

(56) References Cited

U.S. PATENT DOCUMENTS

| | | | |
|---|---|---|---|
| 5,504,033 A | 4/1996 | Bajor et al. | |
| 6,133,619 A | 10/2000 | Sahota et al. | |
| 6,303,413 B1 | 10/2001 | Kalnitsky et al. | |
| 6,653,182 B2 | 11/2003 | Marty et al. | |
| 6,667,226 B2 | 12/2003 | Pinto et al. | |
| 6,812,527 B2 | 11/2004 | Dennard et al. | |
| 6,963,113 B2 | 11/2005 | Ang et al. | |
| 7,078,324 B2 | 7/2006 | Dudek et al. | |
| 7,129,559 B2 * | 10/2006 | Wu et al. | 257/510 |
| 7,479,418 B2 | 1/2009 | Cai et al. | |
| 2005/0224896 A1 * | 10/2005 | Wu et al. | 257/408 |

OTHER PUBLICATIONS

R. E. Burger et al., "Process for Simultaneously Forming Poly/EPI Silicon Filled Deep and Shallow Isolation Trenches Having a CVD Oxide Cap," IBM Technical Disclosure Bulletin, vol. 33, No. 7, Dec. 1990, pp. 388-392.

* cited by examiner

*Primary Examiner* — Richard Booth
(74) *Attorney, Agent, or Firm* — Law Offices of Ira D. Blecker, P.C.

(57) ABSTRACT

An SOI structure including a semiconductor on insulator (SOI) substrate including a top silicon layer, an intermediate buried oxide (BOX) layer and a bottom substrate; at least two wells in the bottom substrate; a deep trench isolation (DTI) separating the two wells, the DTI having a top portion extending through the BOX layer and top silicon layer and a bottom portion within the bottom substrate wherein the bottom portion has a width that is larger than a width of the top portion; and at least two semiconductor devices in the silicon layer located over one of the wells, the at least two semiconductor devices being separated by a shallow trench isolation within the top silicon layer.

7 Claims, 20 Drawing Sheets

SOI DEVICE WITH DTI AND STI

BACKGROUND

The present invention relates to the fabrication of semiconductor devices on a semiconductor on insulator (SOI) substrate, and more particularly, to the fabrication of semiconductor devices on an extremely thin SOI substrate with improved isolation and a thin buried oxide layer.

Extremely thin SOI substrates (ETSOI), also known as fully depleted SOI (FDSOI), rely on an ultra-thin semiconductor layer (for example, silicon) on a buried oxide layer. "Fully-depleted" means that the conducting channel of the transistor is depleted of charge by the time the transistor turns on which can only occur in SOI technologies because in bulk silicon there is an almost infinite source of charge available that cannot be depleted. The performance advantage of fully-depleted transistors comes from the fact that when there is no charge in the channel, the entire gate voltage is applied to create a conducting channel.

ETSOI is a viable device option for extending CMOS scaling. The device characteristics of ETSOI can be tuned by doping and/or applying back gate bias which enables device tuning and/or multiple threshold voltages ($V_T$).

A challenge for enabling the back gate doping and biasing is the isolation.

BRIEF SUMMARY

The various advantages and purposes of the exemplary embodiments as described above and hereafter are achieved by providing, according to a first aspect of the exemplary embodiments, an SOI structure. The SOI structure includes a semiconductor on insulator (SOI) substrate including a top semiconductor layer, an intermediate buried oxide (BOX) layer and a bottom substrate; at least two wells in the bottom substrate; a deep trench isolation (DTI) separating said two wells, the DTI having a top portion extending through the BOX layer and top semiconductor layer and a bottom portion within the bottom substrate wherein the bottom portion has a width that is larger than a width of the top portion; and at least two semiconductor devices in the semiconductor layer located over one of the wells, the at least two semiconductor devices being separated by a shallow trench isolation (STI) within the top semiconductor layer.

According to a second aspect of the exemplary embodiments, there is provided a method of forming an SOI structure. The method includes providing a semiconductor on insulator (SOI) substrate having an SOI layer, an intermediate buried oxide (BOX) layer and a bottom substrate; patterning the SOI layer to form first and second openings in the SOI layer; extending the first openings into the bottom substrate; enlarging the first openings within the bottom substrate; filling the first and second openings with an insulator material to form deep trench isolations (DTIs) from the first openings and shallow trench isolations (STIs) from the second openings; implanting in the bottom substrate between the DTIs to form wells; and forming semiconductor devices in the SOI layer between the DTIs with each semiconductor device being separated from an adjacent semiconductor device by an STI.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 1A to 1G illustrate a first exemplary embodiment in which:

FIG. 1A illustrates an SOI substrate used in the exemplary embodiment:

FIG. 1B illustrates the patterning of the SOI layer;

FIG. 1C illustrates the extending of the DTI trench into the substrate;

FIG. 1D illustrates the filling of the DTI and STI trenches;

FIG. 1E illustrates the forming of N-type and P-type wells in the substrate;

FIG. 1F illustrates the forming of NFETs and PFETs in the SOI layer;

FIG. 1G illustrates the forming of an interlevel dielectric and well contacts.

FIGS. 2A to 2H illustrate a second exemplary embodiment in which:

FIG. 2A illustrates an SOI substrate used in the exemplary embodiment:

FIG. 2B illustrates the patterning of the SOI layer;

FIG. 2C illustrates the forming of spacers;

FIG. 2D illustrates the extending of the DTI trenches into the substrate;

FIG. 2E illustrates the enlarging of the DTI trenches;

FIG. 2F illustrates the filling of the DTI and STI trenches;

FIG. 2G illustrates the forming of N-type and P-type wells in the substrate;

FIG. 2H illustrates the forming of NFETs and PFETs in the SOI layer, the forming of an interlevel dielectric and well contacts.

FIGS. 3A to 3H illustrate a third exemplary embodiment in which:

FIG. 3A illustrates an SOI substrate used in the exemplary embodiment:

FIG. 3B illustrates the patterning of the SOI layer;

FIG. 3C illustrates the conformal deposition of spacer material;

FIG. 3D illustrates the forming of spacers and the extending of the DTI trenches into the substrate;

FIG. 3E illustrates the enlarging of the DTI trenches;

FIG. 3F illustrates the filling of the DTI and STI trenches;

FIG. 3G illustrates the forming of N-type and P-type wells in the substrate;

FIG. 3H illustrates the forming of NFETs and PFETs in the SOI layer, the forming of an interlevel dielectric and well contacts.

FIGS. 4A to 4H illustrate a fourth exemplary embodiment in which:

FIG. 4A illustrates an SOI substrate used in the exemplary embodiment:

FIG. 4B illustrates the patterning of the SOI and BOX layers;

FIG. 4C illustrates the forming of spacers;

FIG. 4D illustrates the extending of the DTI trenches into the substrate;

FIG. 4E illustrates the enlarging of the DTI trenches;

FIG. 4F illustrates the filling of the DTI and STI trenches;

FIG. 4G illustrates the forming of N-type and P-type wells in the substrate;

FIG. 4H illustrates the forming of NFETs and PFETs in the SOI layer, the forming of an interlevel dielectric and well contacts.

FIGS. 5A to 5H illustrate a fifth exemplary embodiment in which:

FIG. 5A illustrates an SOI substrate used in the exemplary embodiment:

FIG. 5B illustrates the patterning of the SOI and BOX layers;

FIG. 5C illustrates the conformal deposition of spacer material;

FIG. 5D illustrates the forming of spacers and the extending of the DTI trenches into the substrate;

FIG. 5E illustrates the enlarging of the DTI trenches;

FIG. 5F illustrates the filling of the DTI and STI trenches;

FIG. 5G illustrates the forming of N-type and P-type wells in the substrate;

FIG. 5H illustrates the forming of NFETs and PFETs in the SOI layer, the forming of an interlevel dielectric and well contacts.

DETAILED DESCRIPTION

In order to tune the $V_T$ of N-type field effect transistor (NFET) and P-type field effect transistor (PFET) devices in ETSOI architecture, doping and/or back gate bias may be applied. Devices sharing the common back-gate bias may be isolated from the rest of the chip by deep-trench isolation. Within the deep-trench isolation region the individual devices may be separated from each other using shallow-trench isolation.

Accordingly, the present exemplary embodiments provide a structure and a method for forming an ETSOI circuit with a deep trench isolation for interwell (well to well) isolation and a shallow trench isolation for intrawell (within the same well) isolation. The lower portion of the deep trench isolation below the buried oxide layer may be enlarged to improve isolation and enhance process window, for example, to improve overlay tolerance.

The present invention relates to the fabrication of a circuit on a semiconductor on insulator (SOI) substrate which includes an SOI layer (for example, silicon), a buried oxide (BOX) layer and a bottom substrate, usually silicon. In exemplary embodiments, the SOI substrate is an extremely thin SOI substrate wherein the SOI layer has a thickness of about 3 to 15 nanometers. In further exemplary embodiments, the BOX layer is a thin BOX layer having a thickness of about 10 to 140 nanometers. This is compared to a typical SOI substrate having an SOI layer with a thickness of about 40-100 nanometers and a BOX layer with a thickness of about 150 nanometers or higher.

The SOI circuit includes deep trench isolation (DTI) for well-to-well isolation and a shallow trench isolation for isolation within the same well. The lower portion of the DTI below the BOX layer is enlarged to improve isolation and enhance the process window such as by improving overlay tolerance.

Figure 1A:
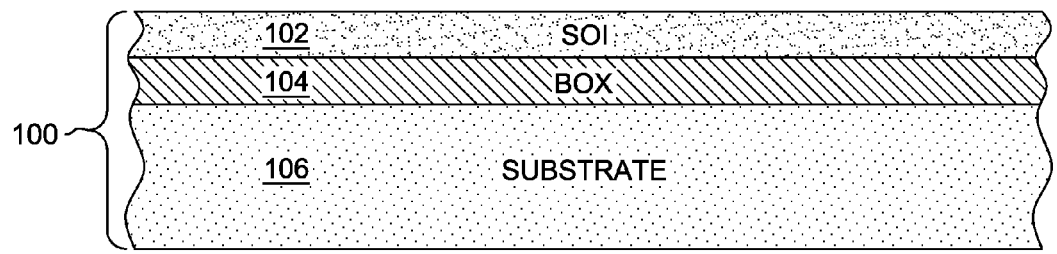

Referring to the Figures in more detail, and particularly referring to FIGS. 1A to 1G, there is illustrated a first exemplary embodiment. In FIG. 1A, an SOI substrate 100 is provided or manufactured. The SOI substrate 100 includes an SOI layer 102, a BOX layer 104 and a bottom substrate 106. In a preferred exemplary embodiment, the SOI layer 102 is an extremely thin SOI layer and the BOX layer 104 is a thin BOX layer.

Figure 1B:
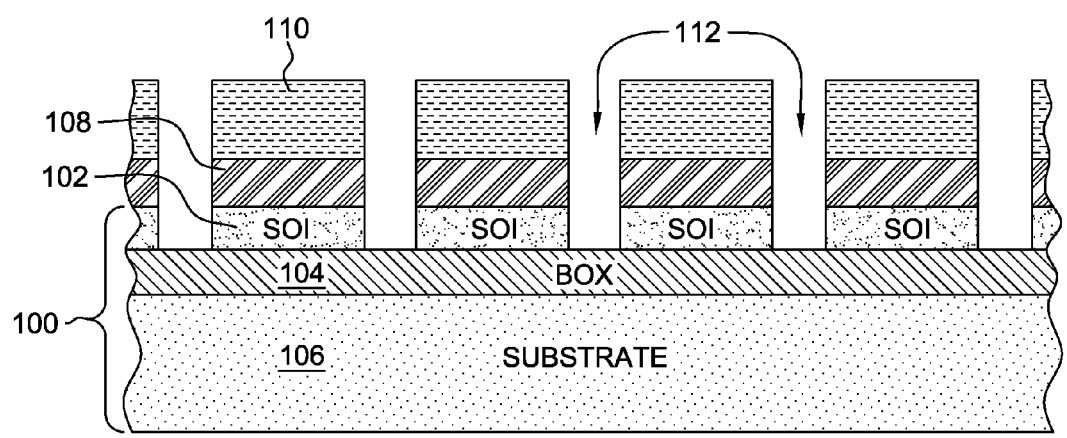

Referring now to FIG. 1B, a pad film 108 may be formed over the SOI layer 102. The pad film 108 is used for patterning the underlying SOI substrate 100 and may include a combination of pad oxide and a pad nitride. Thereafter, a photoresist 110 may be applied, exposed and developed to form openings 112. Through an etching process, such as a conventional reactive ion etching (RIE) process, the openings 112 are extended through pad film 108 and the SOI layer 102 and stopping on the BOX layer 104.

Figure 1C:
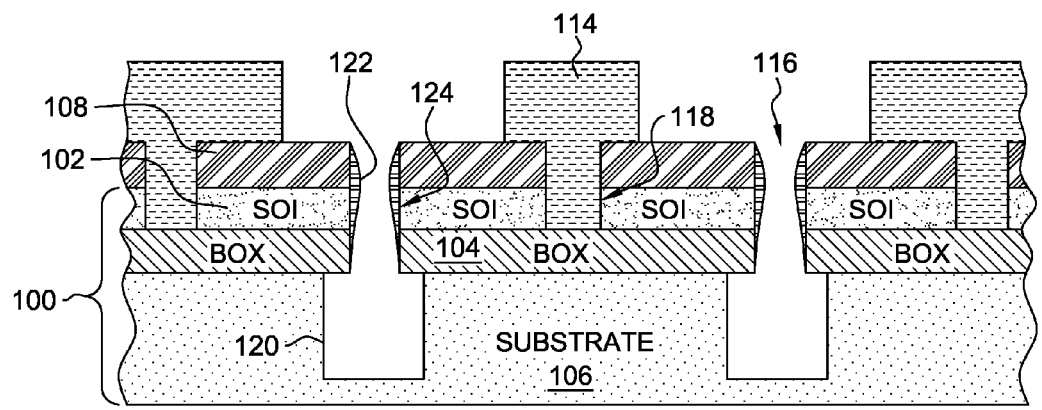

Referring now to FIG. 1C, the first photoresist 110 is conventionally stripped. A second photoresist 114 may be applied, exposed and developed to cover some of the openings 112. Others of the openings 112 are left uncovered. The openings 112 that are left uncovered are referred to hereafter as DTI openings 116 and in a later step will be extended into the bottom substrate 106 and be filled to function as deep trench isolation (DTI). The openings that are covered by the resist 114 are referred to hereafter as STI openings 118 and in a later step will be filled to function as shallow trench isolation (STI).

In a two-step etching process, the DTI openings 116 are extended into the bottom substrate 106 by etching through the box layer 104 and a portion of the bottom substrate 106. It is noted that the DTI openings 116 are enlarged during the two-step etching process to form bottle-shaped openings 120 within the bottom substrate 106. A polymeric residue 122 may be generated during the etching of the DTI openings 116. The polymeric residue 122 may passivate the upper trench sidewall 124 while the lower trench is etched to form the bottle-shaped opening 120. Any reactive ion etch (RIE) process that etches a silicon substrate is suitable for forming the bottle-shaped trench. For example, the process conditions for those two steps may have the same pressure (180 mTorr), same HBr flow rate (325 sccm), same NF3 flow rate (40 sccm), same high frequency power (450 W), but different O2 flow rate (30 sccm for the first step and 20 sccm for the second step), and different low frequency power (900 W for the first step and 1400 W for the second step. The polymeric residue 122 may result from a RIE byproduct such as silicon oxyfluoride ($Si_xO_yF_z$).

The polymeric residue 122 may be stripped, for example, by oxygen plasma and the second resist 114 may be conventionally stripped.

Figure 1D:
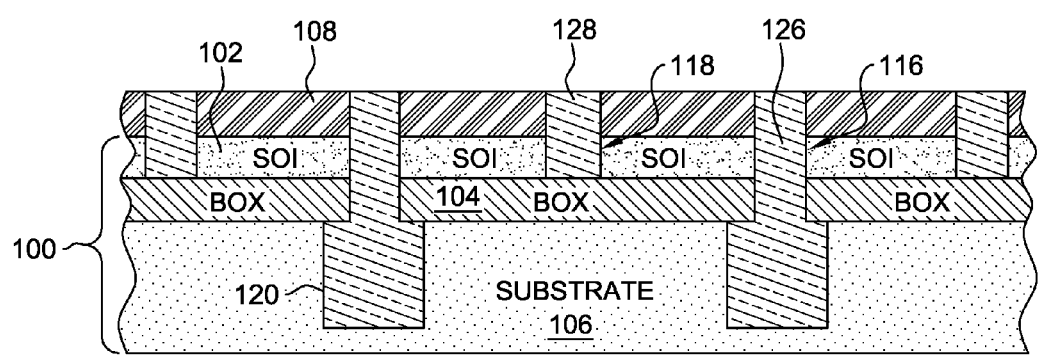

Referring now to FIG. 1D, the DTI openings 116 and STI openings 118 may be filled with an electrically insulating material and then planarized by a conventional chemical-mechanical polishing process. In an exemplary embodiment, the DTI openings and STI openings 118 are filled with an oxide, such as silicon dioxide. There may also be a dielectric liner (for example, silicon nitride) on the walls and bottom of the DTI openings 116 and STI openings 118 prior to deposition of oxide fill. The dielectric liner, if present, may be conformally deposited prior to blanket deposition of the oxide. The DTI openings 116 filled with oxide are now referred to hereafter as deep trench isolation (or just DTI) 126 while the STI openings 118 filled with oxide are now referred to hereafter as shallow trench isolation (or just STI) 128.

Figure 1E:
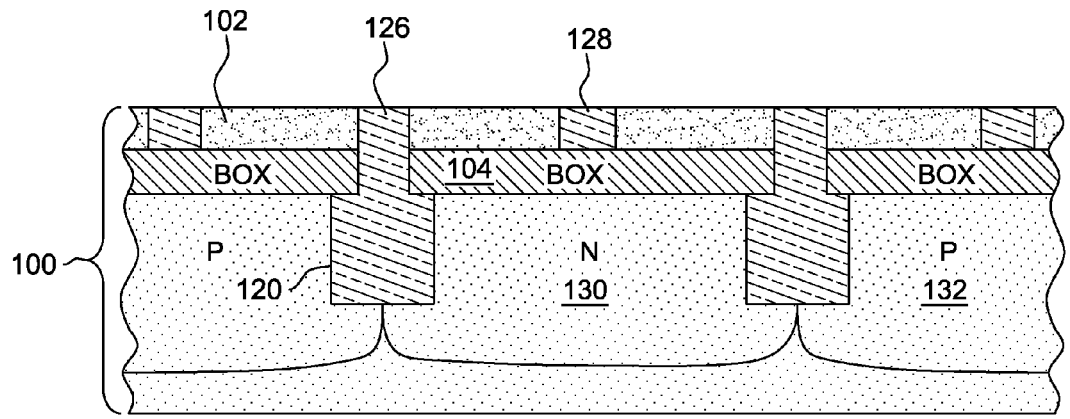

Referring now to FIG. 1E, the pad film 108 (FIG. 1D) is conventionally stripped which also removes an equally thick layer of oxide so that planarization by a process such as chemical-mechanical polishing may not be necessary. The bottom substrate 106 is implanted to form N wells 130 and P wells 132 which will form the back gate for semiconductor devices to be formed hereafter. The implantation may be a multiple-step process. A combination of low and high implantation energies may be used to achieve N and P wells 130, 132 that extend roughly 200 nanometers below the BOX (layer 104) bottom interface into the substrate layer 106. The specie for the N wells 130 may be, for example, arsenic or phosphorus, while the implanted specie for the P wells 132 may be, for example, boron or born fluoride (BF$_2$). DTI 120 provides isolation of N wells 130 and P wells 132.

Figure 1F:
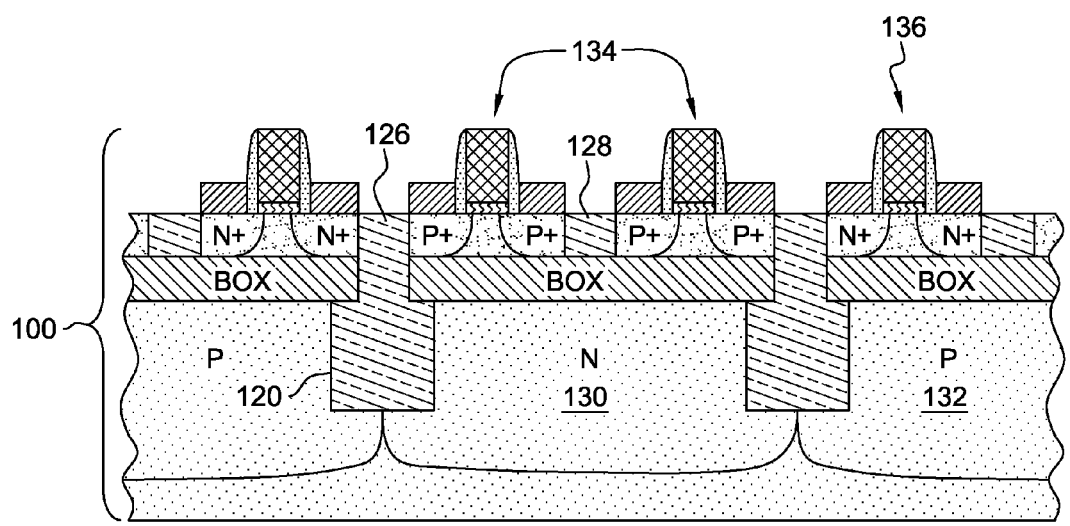

Referring to FIG. 1F, conventional field effect transistor (FET) devices may be formed in SOI layer 102. For purposes of illustration and not limitation, over N well 130 are formed PFETs 134 and over P well 132 are formed NFETs 136. It is also within the scope of the present invention for there to be NFETs over the N well 130 and PFETs over P well 132. Separating the FET devices 134 or 136 is STI 128. For example, PFETs 134 are separated by STI 128 while NFETs 136 are also separated by STI 128. The PFETs 134 and NFETs 136 are shown as having a raised source/drain (RSD).

Figure 1G:
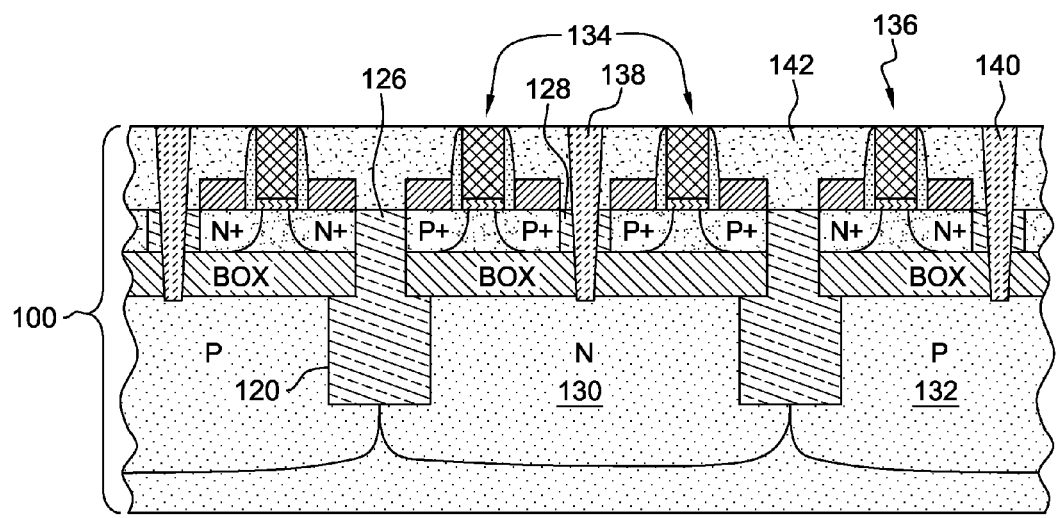

Referring now to FIG. 1G, an interlevel dielectric 142 has been applied over the nFETs 134 and pFETs 136. Well contacts 138 may be formed to contact N wells 130 and well contacts 140 may be formed to contact P wells 132. The well contacts 138, 140 enable the same or different back bias. Well contacts 138, 140 may be formed by masking the FET devices 134, 136, etching through the interlevel dielectric 142, STI 128 and BOX layer 104 and then filling with a metal such as tungsten. There may be a slight overetching into the substrate 106 to ensure good contact with the N wells 130 and P wells 132.

A second exemplary embodiment is illustrated in FIGS. 2A to 2H. The second exemplary embodiment is similar to the first exemplary embodiment except for the formation of spacers after the first trench etch as will be described hereafter.

Figure 2A:
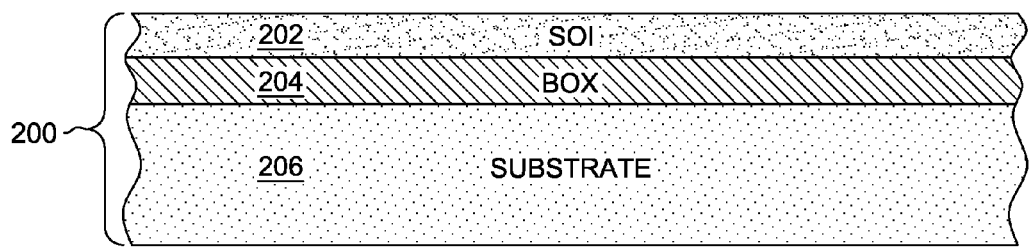

Referring to FIG. 2A, an SOI substrate 200 is provided or manufactured. The SOI substrate 200 includes an SOI layer 202, a BOX layer 204 and a bottom substrate 206. In exemplary embodiments, the SOI substrate is an extremely thin SOI substrate and may have a thin BOX layer as described previously.

Figure 2B:
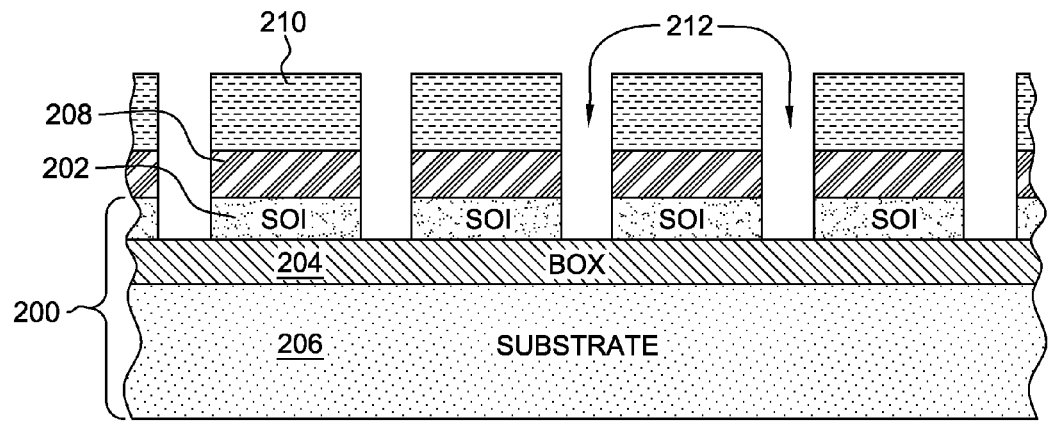

Referring now to FIG. 2B, a pad film 208 may be formed over the SOI layer 202. The pad film 208 and photoresist 210 may be used for forming openings 212 through the photoresist 210, pad film 208 and SOI layer 202 as in the first exemplary embodiment.

Figure 2C:
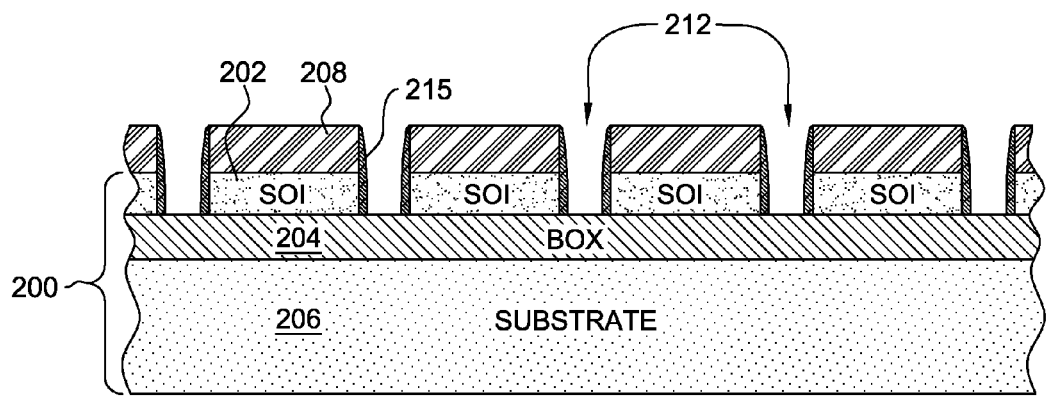

Referring now to FIG. 2C, the first photoresist 210 is conventionally stripped. Thereafter, spacers 215 may be formed on the walls of the openings 212. In an exemplary process, spacer material may be conformally deposited and then etched by a directional (anisotropic) reactive ion etching process to form the spacers 215. The spacers 215 may be made from a material such as silicon oxide, silicon nitride, alumina or a high dielectric constant material such as hafnium oxide or hafnium silicate. The spacers 215 protect the SOI layer 202 in the upper part of the trench when the trench is enlarged in the bottom substrate 206.

Figure 2D:
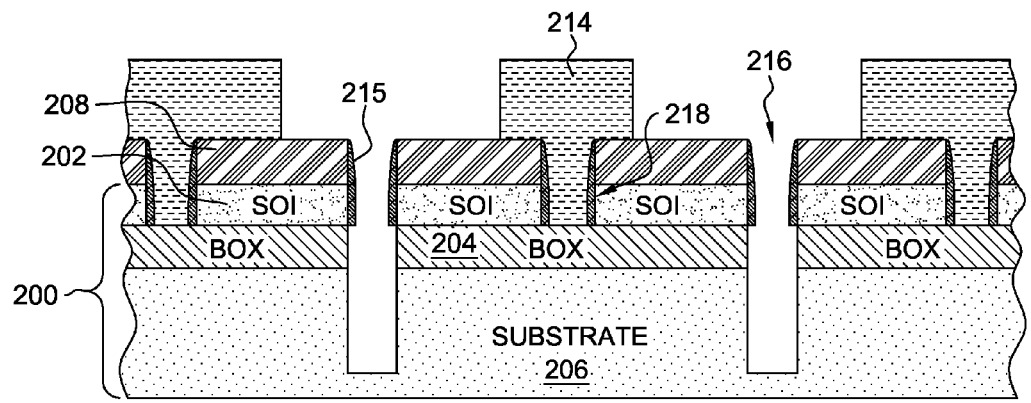

Referring now to FIG. 2D, a second photoresist 214 may be applied, exposed and developed to cover some of the openings 212. Others of the openings 212 are left uncovered. The openings 212 that are left uncovered are referred to hereafter as DTI openings 216 and in a later step will be filled to function as deep trench isolation. The openings that are covered by the resist 214 are referred to hereafter as STI openings 218 and in a later step will be filled to function as shallow trench isolation.

The DTI openings 216 are extended into the bottom substrate 206 by etching through the box layer 204 and a portion of the bottom substrate 206. A directional RIE process may be used to extend the openings 216. A RIE process similar to that in the first exemplary embodiment to extend the openings may be utilized here except that only the first step of the 2-step RIE process is used. In this exemplary embodiment, the DTI openings are extended in a first step and then enlarged as described hereafter in a second step.

Figure 2E:
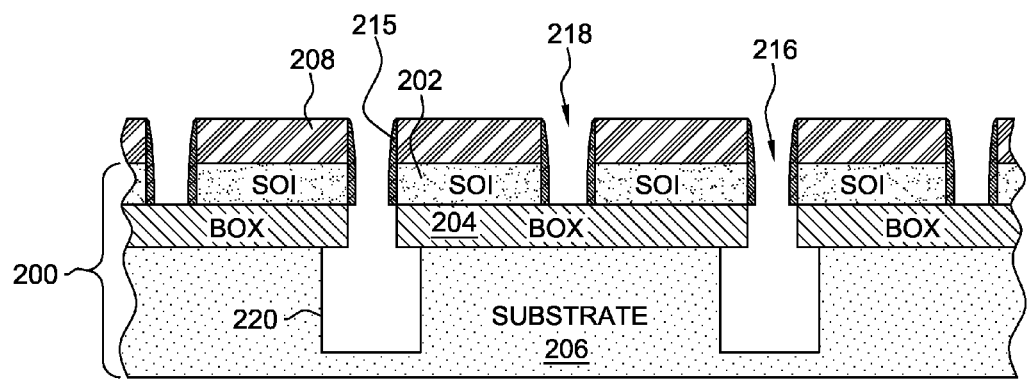

Referring to FIG. 2E, the DTI openings 216 are enlarged in the bottom substrate 206 during the etching process to form bottle-shaped openings 220 within the bottom substrate 206. The enlargement of the DTI openings 216 may be performed by a silicon etch process such as a wet etch by ammonia. The second photoresist 214 (FIG. 2D) may be conventionally stripped either before or after the formation of the bottle-shaped openings 220.

Figure 2F:
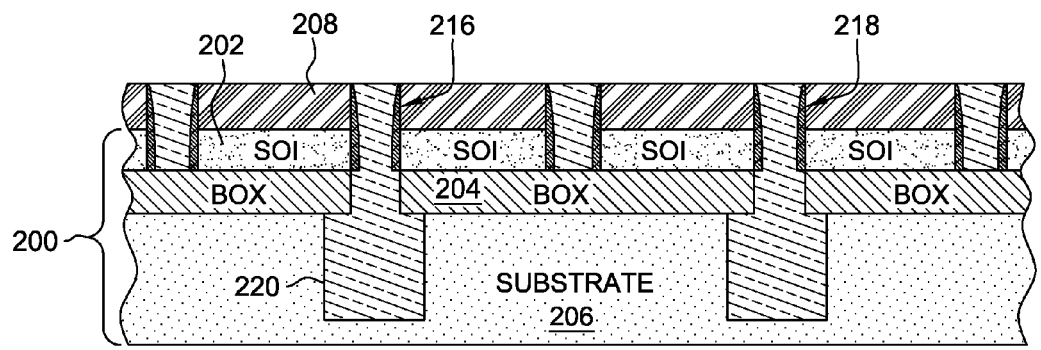
Figure 2G:
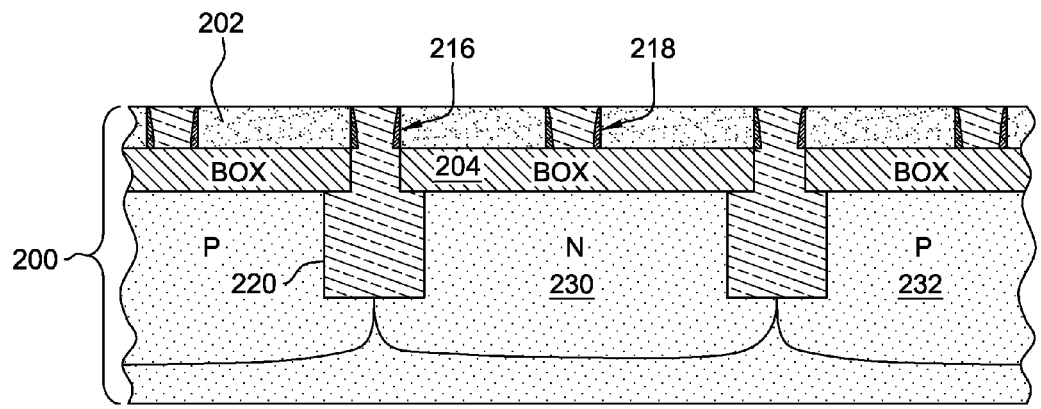
Figure 2H:
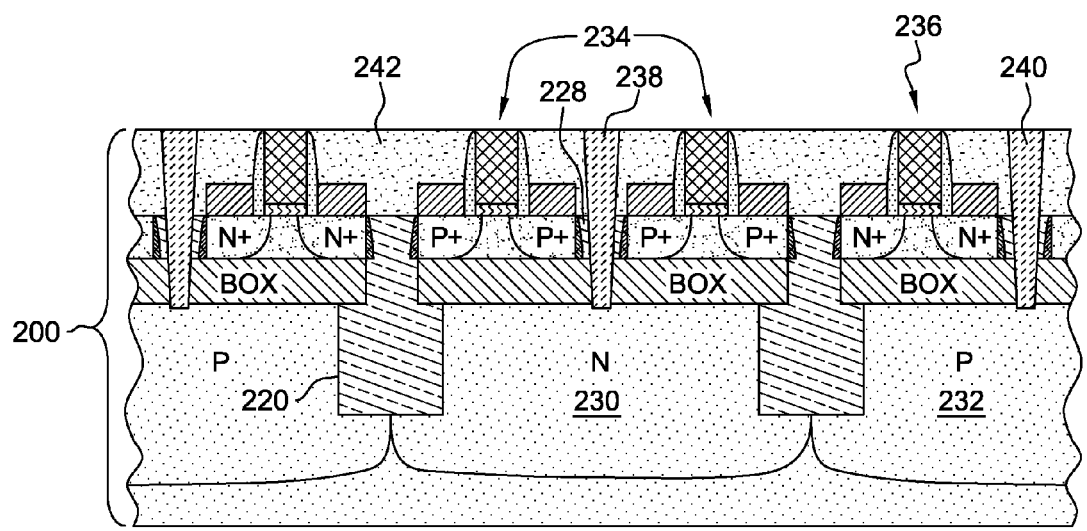

Referring now to FIGS. 2F to 2H, processing of the SOI substrate 200 continues as in the first exemplary embodiment. That is, the DTI openings 216 and STI openings 218 may be filled and then planarized by a conventional chemical-mechanical polishing process as shown in FIG. 2F followed by stripping of the pad film 208 and implanting to form N wells 230 and P wells 232 as shown in FIG. 2G. Thereafter, as shown in FIG. 2H, conventional field effect transistor (FET) devices may be formed in SOI layer 202 separated by STI 228. For purposes of illustration and not limitation, over N well 230 are formed pFETs 234 and over P well 232 are formed nFETs 236. Interlevel dielectric 242 may be deposited and N well contacts 238 and P well contacts 240 may be formed.

A third exemplary embodiment is illustrated in FIGS. 3A to 3H. The third exemplary embodiment is similar to the first exemplary embodiment except for the formation of spacers after the first trench etch and the etching of the spacers occurring after the second lithography as will be described hereafter.

Figure 3A:
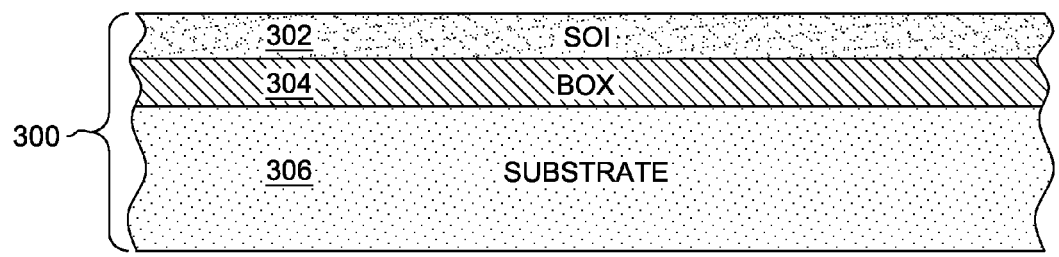

Referring to FIG. 3A, an SOI substrate 300 is provided or manufactured. The SOI substrate 300 includes an SOI layer 302, a BOX layer 304 and a bottom substrate 306. In exemplary embodiments, the SOI substrate is an extremely thin SOI substrate and may have a thin BOX layer as described previously.

Figure 3B:
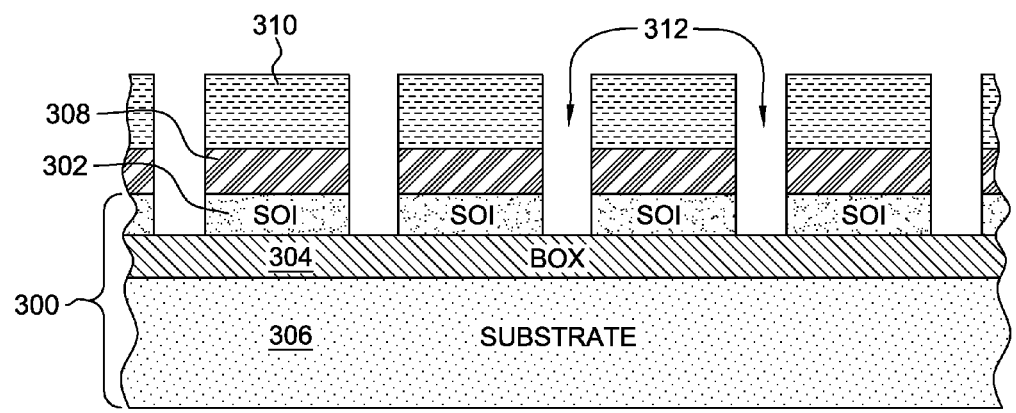

Referring now to FIG. 3B, a pad film 308 may be formed over the SOI layer 302. The pad film 308 and photoresist 310 may be used for forming openings 312 through the photoresist 310, pad film 308 and SOI layer 302 as in the first exemplary embodiment.

Figure 3C:
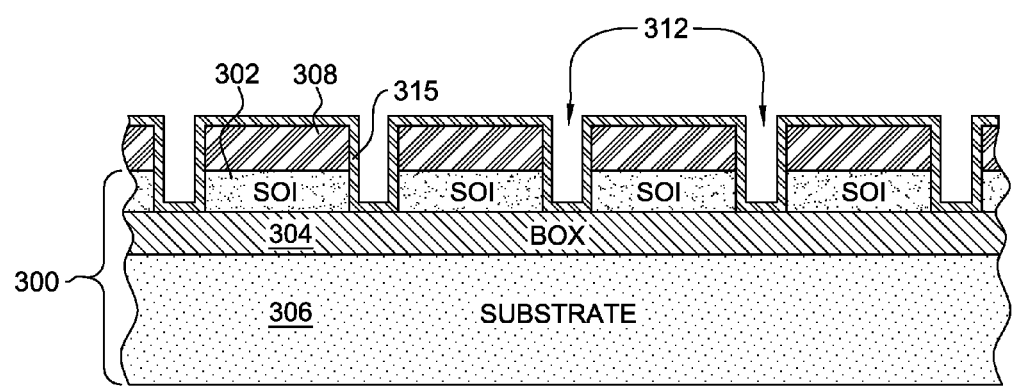

Referring now to FIG. 3C, the first photoresist 310 is conventionally stripped. Thereafter, spacer material 315 may be conformally deposited everywhere so as to cover the walls and bottoms of the openings 312. The spacer material may be a material such as silicon oxide, silicon nitride, alumina or a high dielectric constant material such as hafnium oxide or hafnium silicate.

Figure 3D:
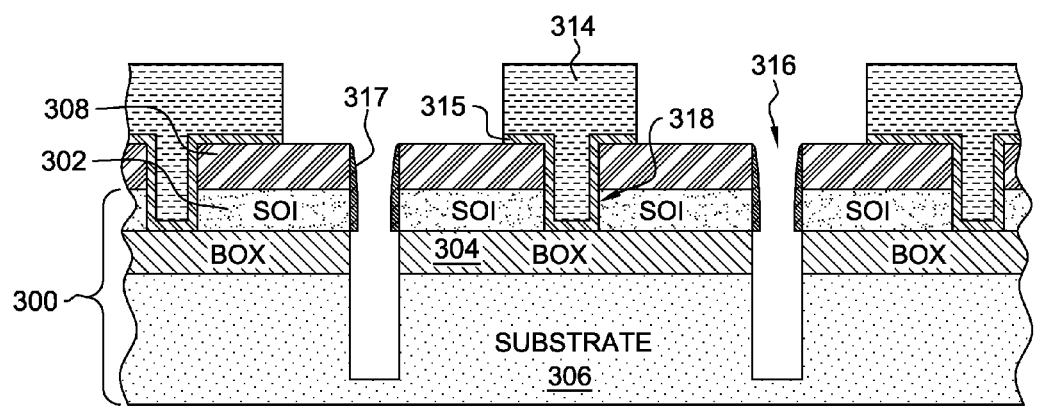

Referring now to FIG. 3D, a second photoresist 314 may be applied, exposed and developed to cover some of the openings 312. Others of the openings 312 are left uncovered. The openings 312 that are left uncovered are referred to hereafter as DTI openings 316 and in a later step will be filled to function as deep trench isolation. The openings that are covered by the resist 314 are referred to hereafter as STI openings 318 and in a later step will be filled to function as shallow trench isolation.

Spacer material 315 within DTI openings 316 may be etched by a directional (anisotropic) reactive ion etching process to form the spacers 317. The spacers 317 protect the SOI layer 302 in the upper part of the trench when the trench is enlarged in the bottom substrate 306. The DTI openings 316 are extended into the bottom substrate 306 by a second directional reactive ion etching process (as described above in the second exemplary embodiment) through the box layer 304 and a portion of the bottom substrate 306.

Unetched spacer material 315 within STI openings 318 protected by the second photoresist 314 ensures a robust layer of spacer material 315 on the walls and bottom of the STI openings 318 and may help to prevent undesired electrical connection between the SOI layer 302 and the bottom substrate 306.

Figure 3E:
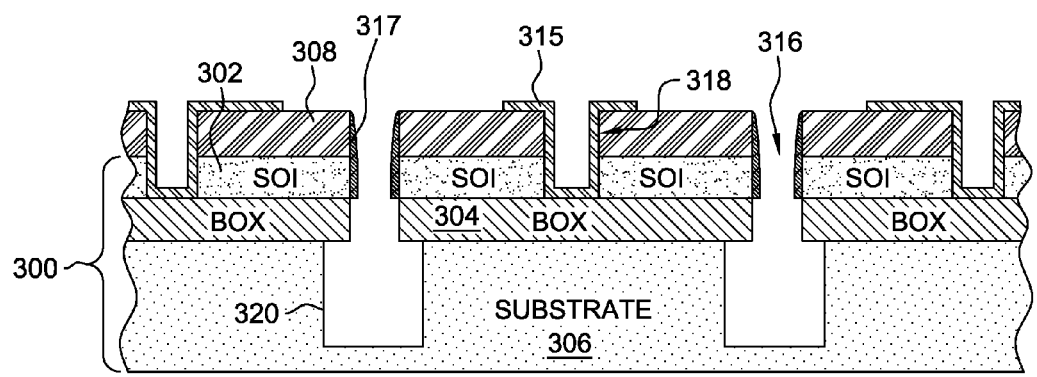

Referring to FIG. 3E, the DTI openings 316 are enlarged in the bottom substrate 306 during the etching process to form bottle-shaped openings 320 within the bottom substrate 306. The enlargement of the DTI openings 316 may be performed by a silicon etch process such as a wet etch by ammonia. The second photoresist 314 (FIG. 3D) may be conventionally stripped either before or after the formation of the bottle-shaped openings 320.

Figure 3F:
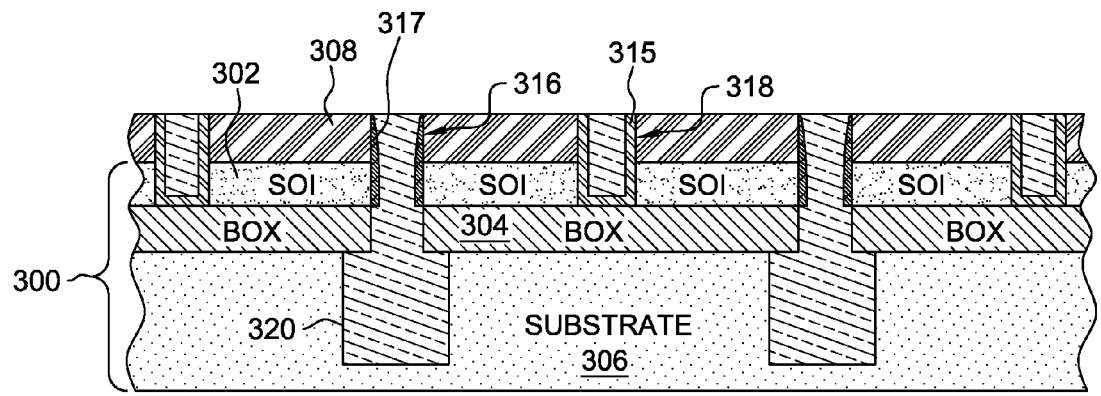
Figure 3G:
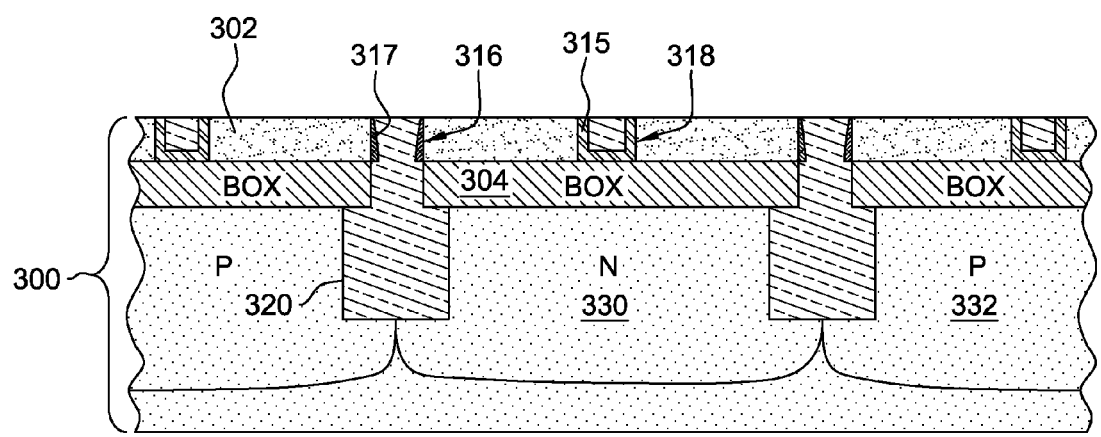
Figure 3H:
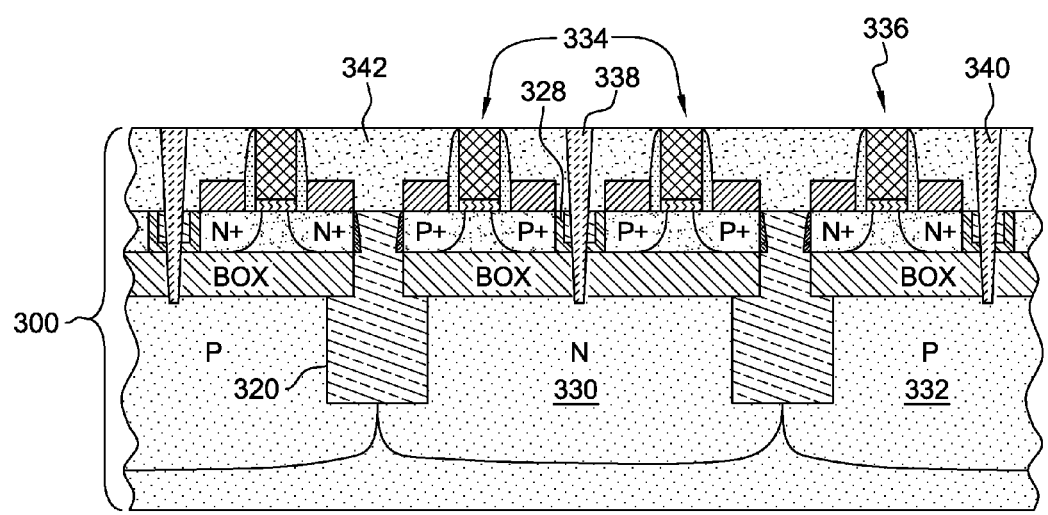

Referring now to FIGS. 3F to 3H, processing of the SOI substrate 300 continues as in the first exemplary embodiment. That is, the DTI openings 316 and STI openings 318 may be filled and then planarized by a conventional chemical-mechanical polishing process as shown in FIG. 3F followed by stripping of the pad film 308 and implanting to form N wells 330 and P wells 332 as shown in FIG. 3G. Thereafter, as shown in FIG. 3H, conventional field effect transistor (FET) devices may be formed in SOI layer 302 separated by STI 328. For purposes of illustration and not limitation, over N well 330 are formed pFETs 334 and over P well 332 are formed nFETs 336. Interlevel dielectric 342 may be deposited and N well contacts 338 and P well contacts 340 may be formed.

A fourth exemplary embodiment is illustrated in FIGS. 4A to 4H. The fourth exemplary embodiment is similar to the first exemplary embodiment except for the etching of the SOI layers and the BOX layer during the first trench etch and for the formation of spacers after the first trench etch.

Figure 4A:
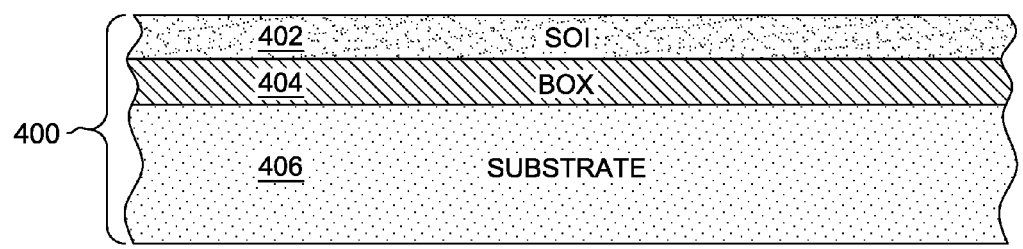

Referring to FIG. 4A, an SOI substrate 400 is provided or manufactured. The SOI substrate 400 includes an SOI layer 402, a BOX layer 404 and a bottom substrate 406. In exemplary embodiments, the SOI substrate is an extremely thin SOI substrate and may have a thin BOX layer as described previously.

Figure 4B:
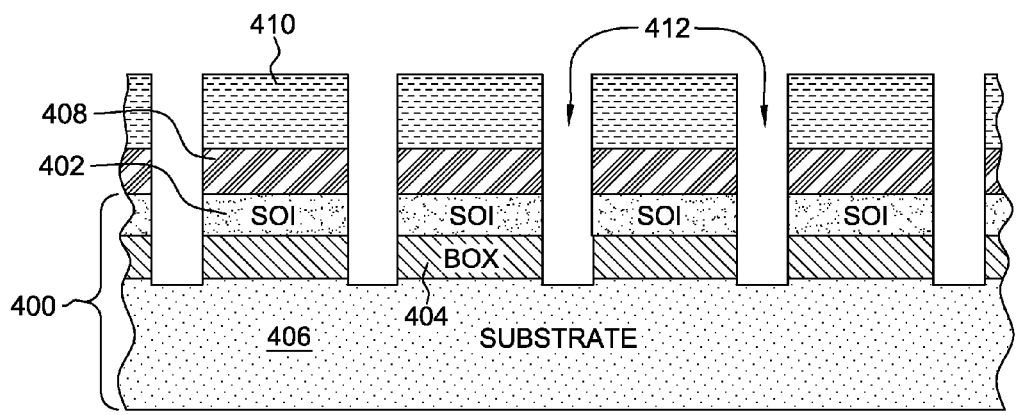

Referring now to FIG. 4B, a pad film 408 may be formed over the SOI layer 402. The pad film 408 and photoresist 410 may be used for forming openings 412 through the photoresist 410, pad film 408 and SOI layer 402 as in the first exemplary embodiment. However, in this fourth exemplary embodiment, the openings 412 are further extended through the BOX layer 404. There may also be a slight overetch into the bottom substrate 406 to ensure that the BOX layer 404 is completely etched through.

Figure 4C:
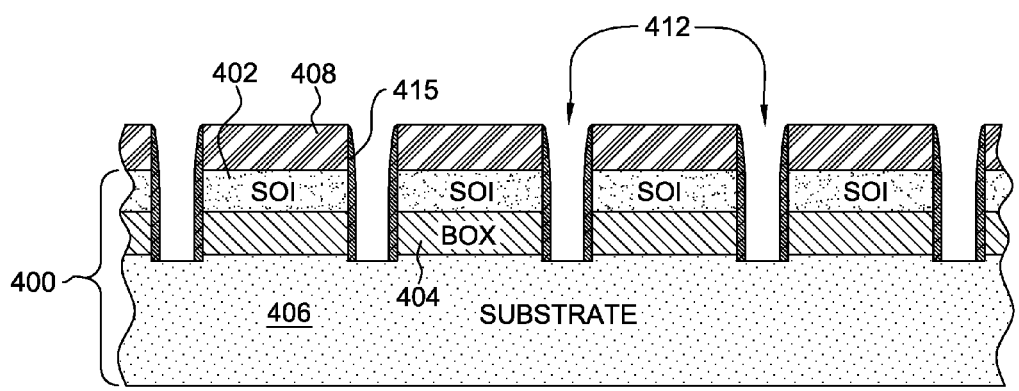

Referring now to FIG. 4C, the first photoresist 410 is conventionally stripped. Thereafter, spacers 415 may be formed on the walls of the openings 412. Spacer material may be conformally deposited and then etched by a directional (anisotropic) reactive ion etching process to form the spacers 415. The spacers may be made from a material such as silicon oxide, silicon nitride, alumina or a high dielectric constant material such as hafnium oxide or hafnium silicate. The spacers 415 protect the SOI layer 402 and BOX layer 404 in the upper part of the trench when the trench is enlarged in the bottom substrate 406.

Figure 4D:
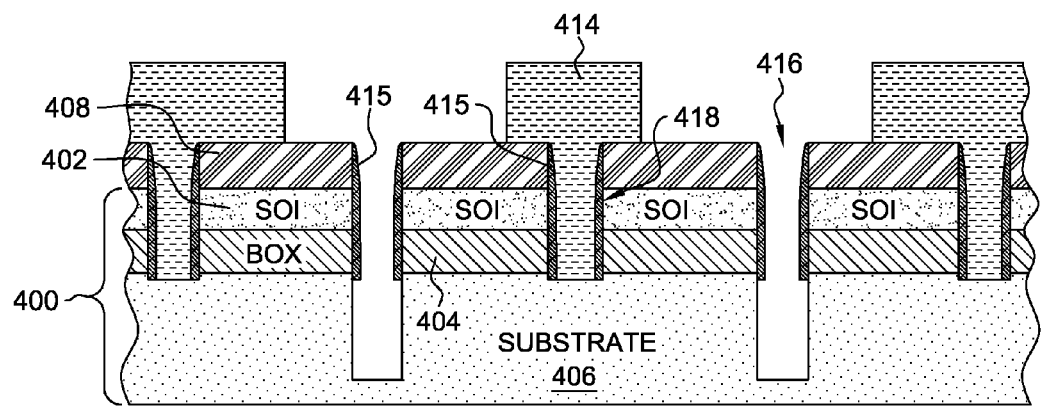

Referring now to FIG. 4D, a second photoresist 414 may be applied, exposed and developed to cover some of the openings 412. Others of the openings 412 are left uncovered. The openings 412 that are left uncovered are referred to hereafter as DTI openings 416 and in a later step will be filled to function as deep trench isolation. The openings that are covered by the resist 414 are referred to hereafter as STI openings 418 and in a later step will be filled to function as shallow trench isolation.

The DTI openings 416 are extended into the bottom substrate 406 by a directional reactive ion etching process (as described above in the second exemplary embodiment) through a portion of the bottom substrate 406.

Figure 4E:
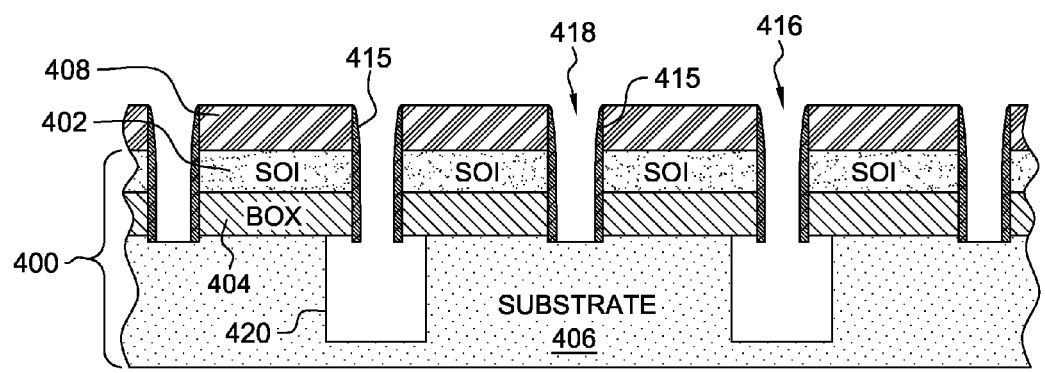

Referring to FIG. 4E, the DTI openings 416 are enlarged in the bottom substrate 406 during the etching process to form bottle-shaped openings 420 within the bottom substrate 406. The enlargement of the DTI openings 416 may be performed by a silicon etch process such as a wet etch by ammonia. The second photoresist 414 (FIG. 4D) may be conventionally stripped either before or after the formation of the bottle-shaped openings 420.

Figure 4F:
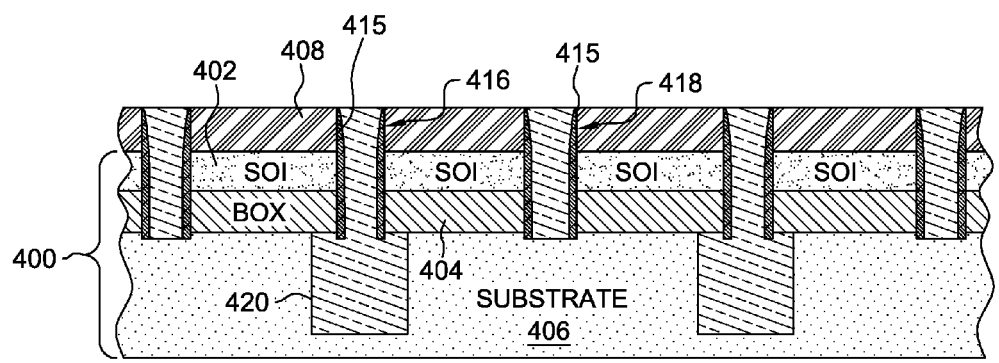
Figure 4G:
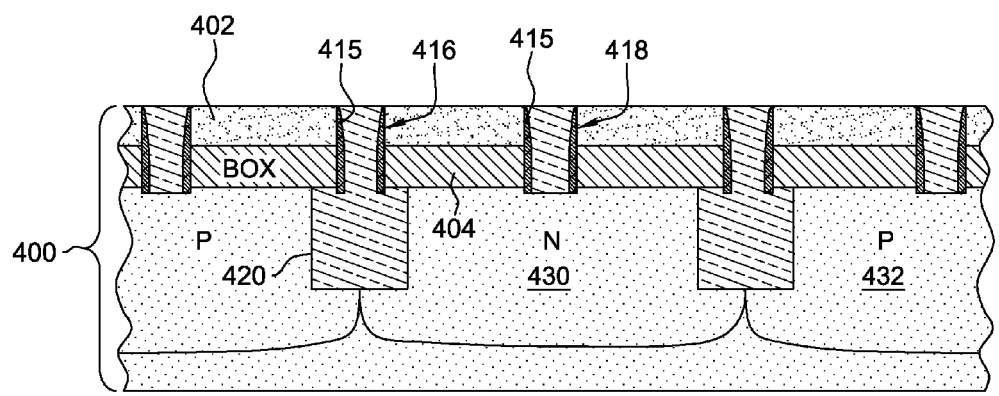
Figure 4H:
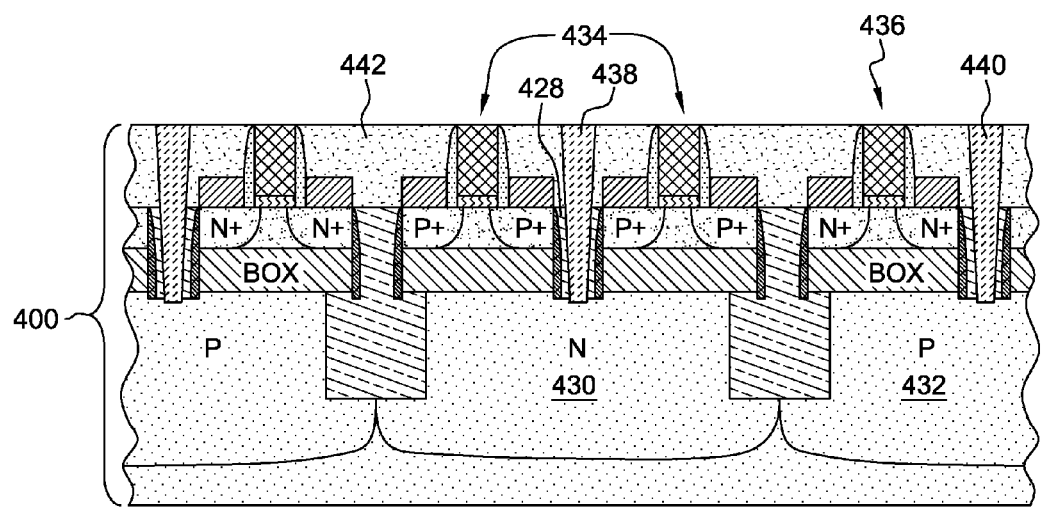

Referring now to FIGS. 4F to 4H, processing of the SOI substrate 400 continues as in the first exemplary embodiment. That is, the DTI openings 416 and STI openings 418 may be filled and then planarized by a conventional chemical-mechanical polishing process as shown in FIG. 4F followed by stripping of the pad film 408 and implanting to form N wells 430 and P wells 432 as shown in FIG. 4G. Thereafter, as shown in FIG. 4H, conventional field effect transistor (FET) devices may be formed in SOI layer 402 separated by STI 428. For purposes of illustration and not limitation, over N well 430 are formed pFETs 434 and over P well 432 are formed nFETs 436. Interlevel dielectric 442 may be deposited and N well contacts 438 and P well contacts 440 may be formed.

A fifth exemplary embodiment is illustrated in FIGS. 5A to 5H. The fifth exemplary embodiment is similar to the first exemplary embodiment except for the etching of the SOI layers and the BOX layer during the first trench etch, the formation of spacers after the first trench etch and the etching of the spacers occurring after the second lithography as will be described hereafter.

Figure 5A:
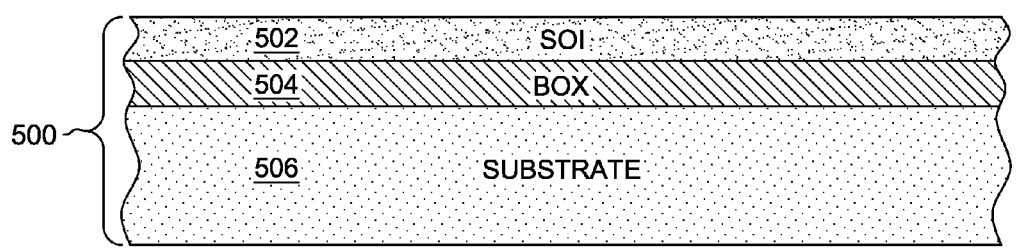

Referring to FIG. 5A, an SOI substrate 500 is provided or manufactured. The SOI substrate 500 includes an SOI layer 502, a BOX layer 504 and a bottom substrate 506. In exemplary embodiments, the SOI substrate is an extremely thin SOI substrate and may have a thin BOX layer as described previously.

Figure 5B:
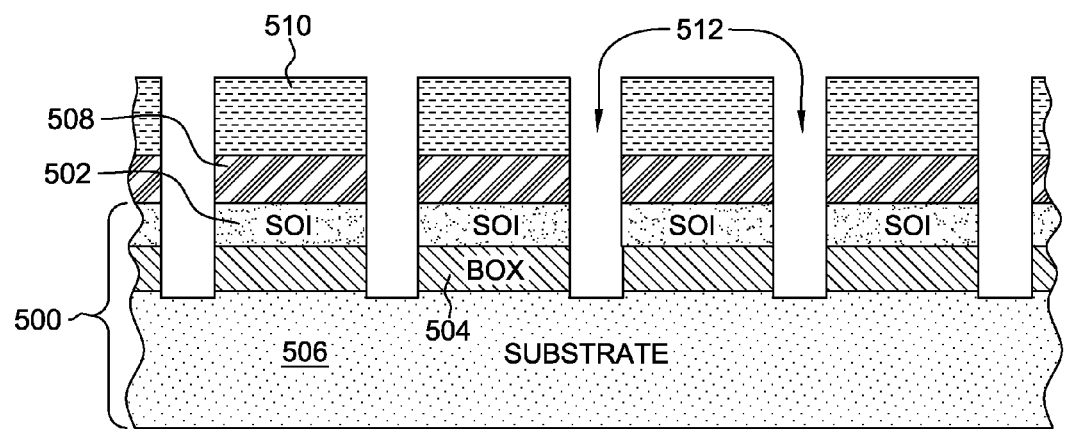

Referring now to FIG. 5B, a pad film 508 may be formed over the SOI layer 502. The pad film 508 and photoresist 510 may be used for forming openings 512 through the photoresist 510, pad film 508 and SOI layer 502 as in the first exemplary embodiment. However, in this fifth exemplary embodiment, the openings 512 are further extended through the BOX layer 504. There may also be a slight overetch into the bottom substrate 506 to ensure that the BOX layer 504 is completely etched through.

Figure 5C:
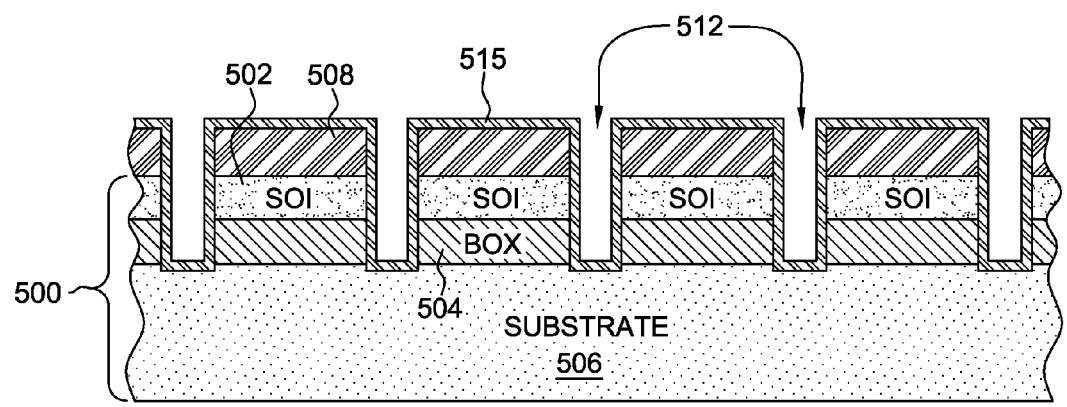

Referring now to FIG. 5C, the first photoresist 510 is conventionally stripped. Thereafter, spacer material 515 may be conformally deposited everywhere so as to cover the walls and bottoms the openings 512. The spacer, material may be a material such as silicon oxide, silicon nitride, alumina or a high dielectric constant material such as hafnium oxide or hafnium silicate.

Figure 5D:
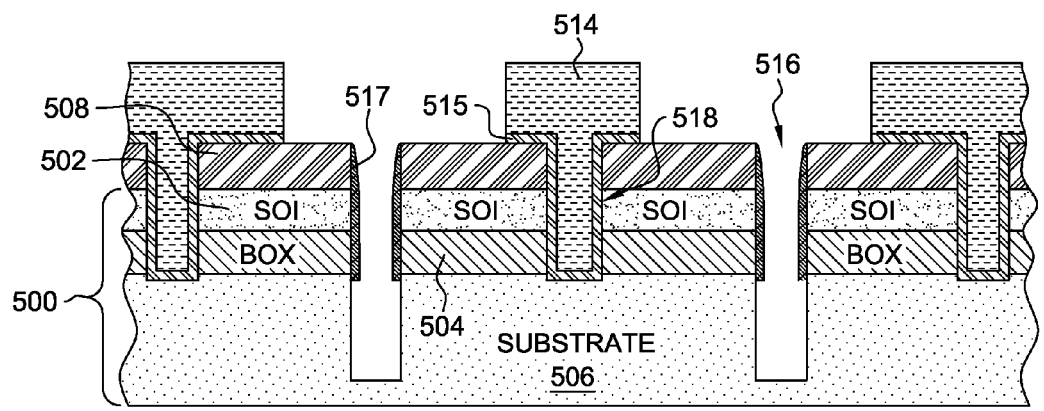

Referring now to FIG. 5D, a second photoresist 514 may be applied, exposed and developed to cover some of the openings 512. Others of the openings 512 are left uncovered. The openings 512 that are left uncovered are referred to hereafter as DTI openings 516 and in a later step will be filled to function as deep trench isolation. The openings that are covered by the resist 514 are referred to hereafter as STI openings 518 and in a later step will be filled to function as shallow trench isolation.

Spacer material 515 within DTI openings 516 may be etched by a directional (anisotropic) reactive ion etching process to form the spacers 517. The spacers 517 protect the SOI layer 502 and BOX layer 504 in the upper part of the trench when the trench is enlarged in the bottom substrate 506. The DTI openings 516 are extended into the bottom substrate 506 in a second directional reactive ion etching process (as described above in the second exemplary embodiment) by etching through a portion of the bottom substrate 506.

Unetched spacer material 515 within STI openings 518 protected by the second photoresist 514 ensures a robust layer of spacer material 515 on the walls and bottom of the STI openings 518 and may help to prevent undesired electrical connection between the SOI layer 502 and the bottom substrate 506.

Figure 5E:
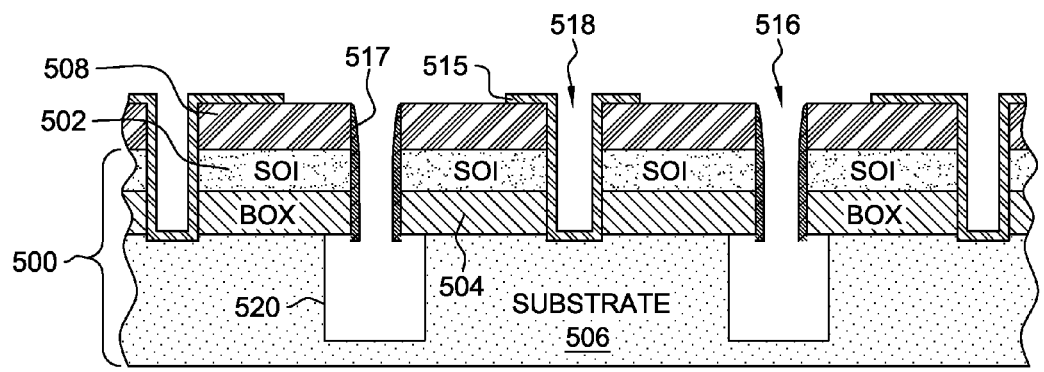

Referring to FIG. 5E, the DTI openings 516 are enlarged in the bottom substrate 506 during the etching process to form bottle-shaped openings 520 within the bottom substrate 506. The enlargement of the DTI openings 516 may be performed by a silicon etch process such as a wet etch by ammonia. The second photoresist 514 (FIG. 5D) may be conventionally stripped either before or after the formation of the bottle-shaped openings 520.

Figure 5F:
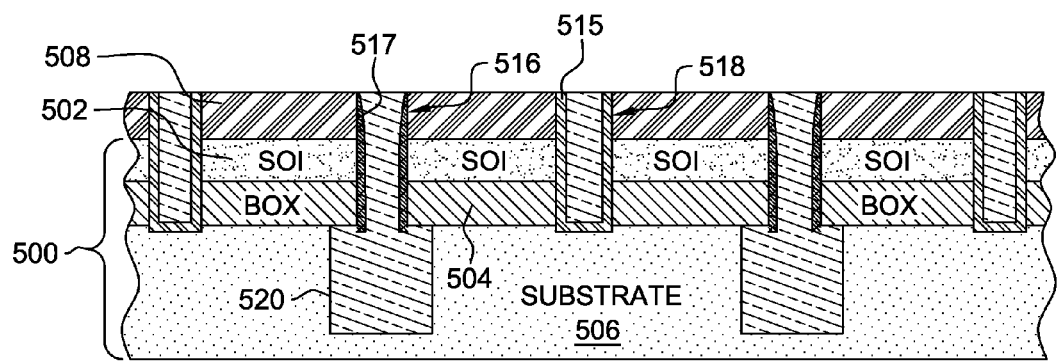
Figure 5G:
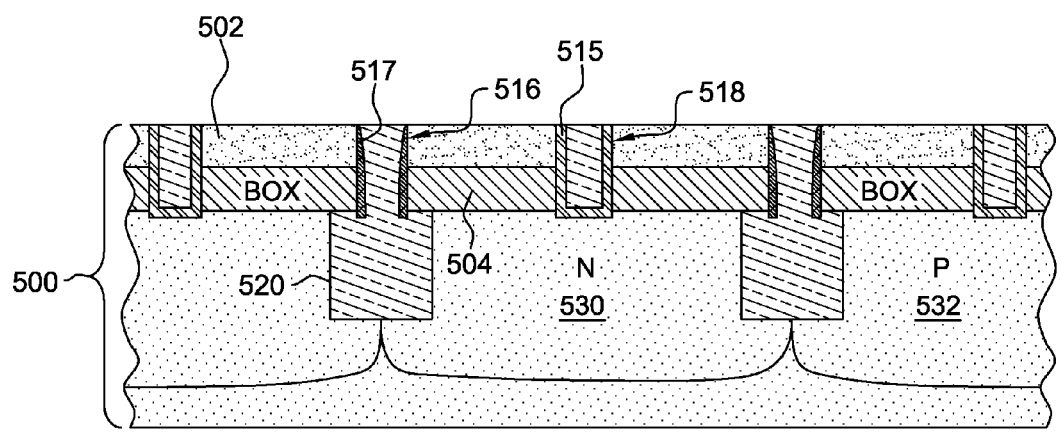
Figure 5H:
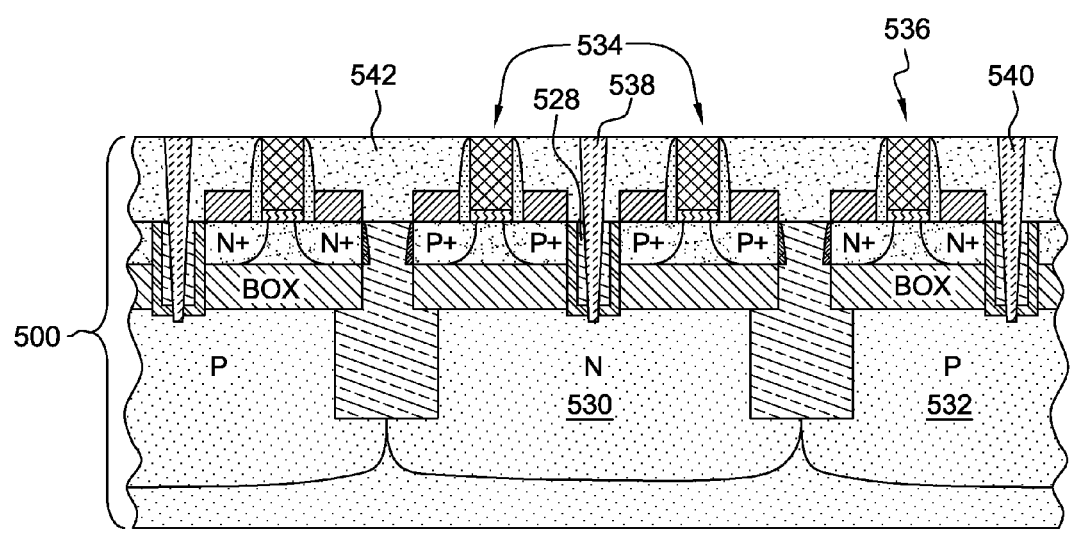

Referring now to FIGS. 5F to 5H, processing of the SOI substrate 500 continues as in the first exemplary embodiment. That is, the DTI openings 516 and STI openings 518 may be filled and then planarized by a conventional chemical-mechanical polishing process as shown in FIG. 5F followed by stripping of the pad film 508 and implanting to form N wells 530 and P wells 532 as shown in FIG. 5G. Thereafter, as shown in FIG. 5H, conventional field effect transistor (FET) devices may be formed in SOI layer 502 separated by STI 528. For purposes of illustration and not limitation, over N well 530 are formed pFETs 534 and over P well 532 are formed nFETs 536. Interlevel dielectric 542 may be deposited and N well contacts 538 and P well contacts 540 may be formed.

After the processing described in FIGS. 1A to 1G, 2A to 2H, 3A to 3H, 4A to 4H and 5A to 5H, further conventional processing to form contacts and back end of the line wiring layers may proceed hereafter to form a semiconductor device such as a MOSFET. It is to be understood that the semiconductor structures shown in FIGS. 1A to 1G, 2A to 2H, 3A to 3H, 4A to 4H and 5A to 5H form only a part of a MOSFET and that there will be a plurality of such semiconductor structures in the finished MOSFET.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. An SOI structure comprising:
   a semiconductor on insulator (SOI) substrate including a top semiconductor layer, an intermediate buried oxide (BOX) layer and a bottom substrate;
   at least two wells in the bottom substrate;
   a deep trench isolation (DTI) separating said two wells, the DTI having a top portion extending through the BOX layer and top semiconductor layer and a bottom portion within the bottom substrate wherein the bottom portion has a width that is larger than a width of the top portion; and
   at least two semiconductor devices in the semiconductor layer located over one of the wells, the at least two semiconductor devices being separated by a shallow trench isolation (STI) within the top semiconductor layer.

2. The SOI structure of claim 1 wherein the SOI substrate is an extremely thin SOI substrate.

3. The SOI structure of claim 2 wherein the top semiconductor layer has a thickness of 3 to 15 nanometers.

4. The SOI structure of claim 1 wherein the BOX layer has a thickness of 10 to 140 nanometers.

5. The SOI structure of claim 1 further comprising spacers on a wall of the top silicon layer in the DTI and STI.

6. The SOI structure of claim 1 further comprising spacers on a wall of the top silicon layer and BOX layer in the DTI and STI.

7. The SOI structure of claim 1. wherein one of the wells is an N-type well and one of the wells is a P-type well.

* * * * *